(12) United States Patent
Sheng

(10) Patent No.: US 8,250,516 B2
(45) Date of Patent: Aug. 21, 2012

(54) PRINTED CIRCUIT BOARD LAYOUT SYSTEM AND METHOD FOR MERGING OVERLAPPING POLYGONS INTO IRREGULAR SHAPES

(75) Inventor: Xiao-Cheng Sheng, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 210 days.

(21) Appl. No.: 12/788,324

(22) Filed: May 27, 2010

(65) Prior Publication Data

US 2011/0066993 A1  Mar. 17, 2011

(30) Foreign Application Priority Data

Sep. 11, 2009  (CN) .......................... 2009 1 0306907

(51) Int. Cl.
 *G06F 17/50* (2006.01)

(52) U.S. Cl. ......... 716/137; 716/119; 716/122; 716/139

(58) Field of Classification Search .................. 716/119, 716/122, 137, 139
 See application file for complete search history.

(56) References Cited

U.S. PATENT DOCUMENTS

| | | | | |
|---|---|---|---|---|
| 4,829,446 A * | 5/1989 | Draney | ............................ | 716/55 |
| 5,251,140 A * | 10/1993 | Chung et al. | .................. | 700/160 |
| 5,633,804 A * | 5/1997 | Bever | ............................. | 716/102 |
| 7,197,738 B1 * | 3/2007 | Hetzel et al. | .................. | 716/126 |
| 7,507,113 B2 * | 3/2009 | Aida et al. | ..................... | 439/501 |
| 7,827,514 B2 * | 11/2010 | Beattie et al. | ................. | 716/102 |
| 2003/0028630 A1 * | 2/2003 | Bischof et al. | ................ | 709/223 |
| 2007/0277372 A1 * | 12/2007 | Aida et al. | ...................... | 29/747 |
| 2010/0205570 A1 * | 8/2010 | Chapman | ........................... | 716/3 |
| 2011/0018905 A1 * | 1/2011 | Sheng | .......................... | 345/689 |
| 2011/0035719 A1 * | 2/2011 | Sheng | .......................... | 716/136 |
| 2011/0078643 A1 * | 3/2011 | Sheng | .......................... | 716/106 |
| 2011/0099564 A1 * | 4/2011 | Sheng | .......................... | 719/330 |
| 2011/0107282 A1 * | 5/2011 | Sheng | .......................... | 716/106 |
| 2011/0119647 A1 * | 5/2011 | Sheng | .......................... | 716/122 |

* cited by examiner

*Primary Examiner* — Naum Levin
(74) *Attorney, Agent, or Firm* — Altis Law Group, Inc.

(57) ABSTRACT

A method for merging polygons of a printed circuit board layout system is provided. The system generates PCB files according to the input wiring diagram, and generates polygons and records the profile attributes of each of the generated polygons. The method includes obtaining the profile attributes in response to user input. Then storing the obtained profile attributes and selecting two profile attributes. Then determining whether the polygons are overlapping and recording a new file attribute describing the shape of a new polygon of the two polygons combined shape excluding the lines indicating the overlapping portions of the two polygons. Finally, updating the opened PCB file with the new profile attribute if the polygons are overlapping. A related system is also provided.

6 Claims, 7 Drawing Sheets

PRINTED CIRCUIT BOARD LAYOUT SYSTEM AND METHOD FOR MERGING OVERLAPPING POLYGONS INTO IRREGULAR SHAPES

BACKGROUND

1. Technical Field

The present disclosure relates to the printed circuit board (PCB) layout field and, particularly, to a PCB layout system and a method thereof.

2. Description of Related Art

In a PCB diagram, there is usually one or more large irregular polygons on which copper foils are spread. Using conventional software for PCB layout such as Cadence System's ALLEGRO, in order to obtain one large irregular polygon, the conventional software generates several overlapping polygons. To merge the polygons into one larger polygon, a designer first selects two overlapping polygons which are then merged by the software, and then another two and so on, and the merged pairs of polygons are merged together until a polygon of the desired size is obtained. As shown in FIG. 1, polygons 11, 22, 33 are overlapping. When the designer selects the polygons 11 and 22, the software merges the polygons 11 and 22 into a polygon 44 (see FIG. 2). The designer then selects the polygons 44 and 33, and the software merges the polygons 44 and 33 into a polygon 55 (see FIG. 3). That is, using the conventional software for PCB layout, the designer has to select pairs of overlapping polygons many times, which is time-consuming.

BRIEF DESCRIPTION OF THE DRAWINGS

The components of the drawings are not necessarily drawn to scale, the emphasis instead being placed upon clearly illustrating the principles of a printed circuit board layout system and a method thereof. Moreover, in the drawings, like reference numerals designate corresponding parts throughout several views.

DETAILED DESCRIPTION

Figure 1:
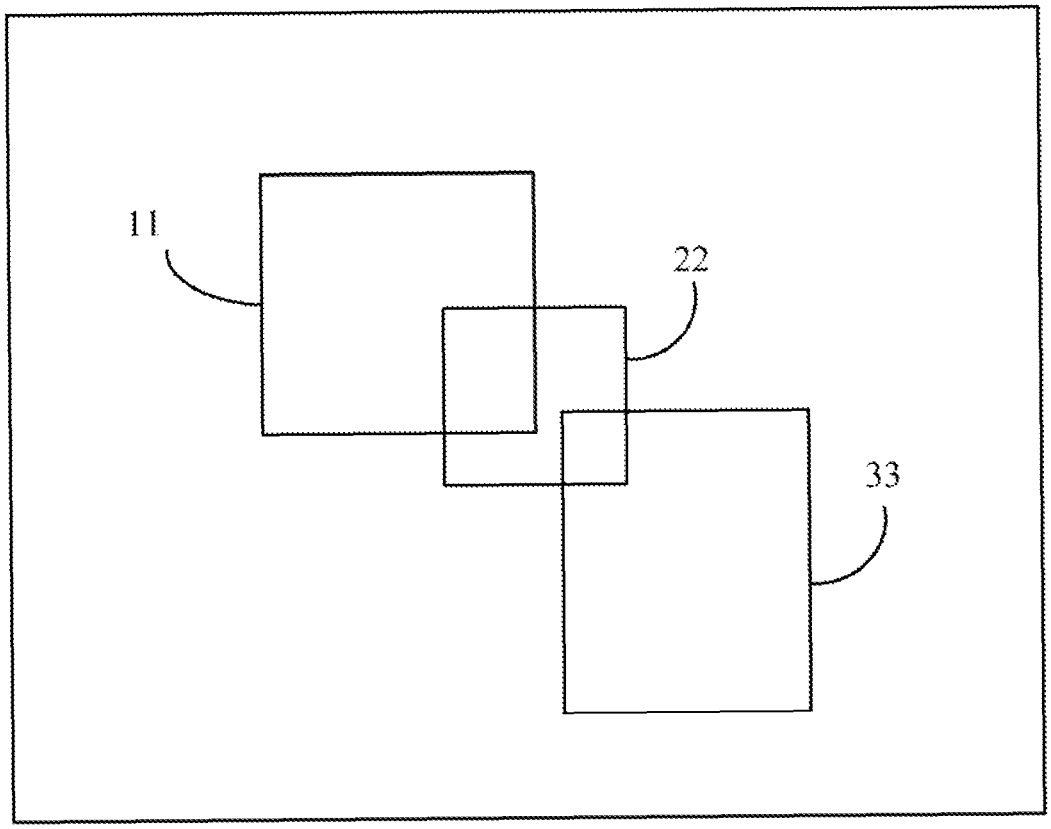
FIG. 1 is a schematic view showing overlapping polygons in a displayed wiring diagram of a conventional printed circuit board layout system.
Figure 2:
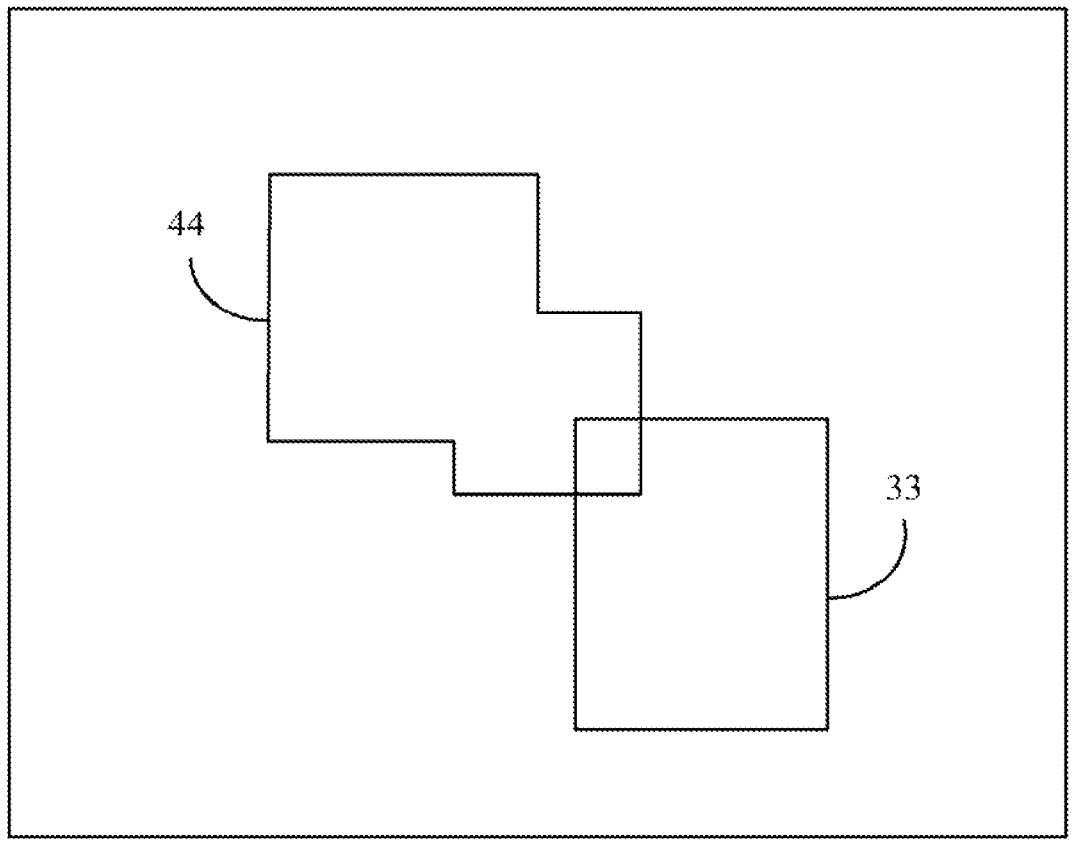
FIG. 2 is a schematic view showing two polygons merged into a polygon in the displayed wiring diagram of the conventional printed circuit board layout system of FIG. 1.
Figure 3:
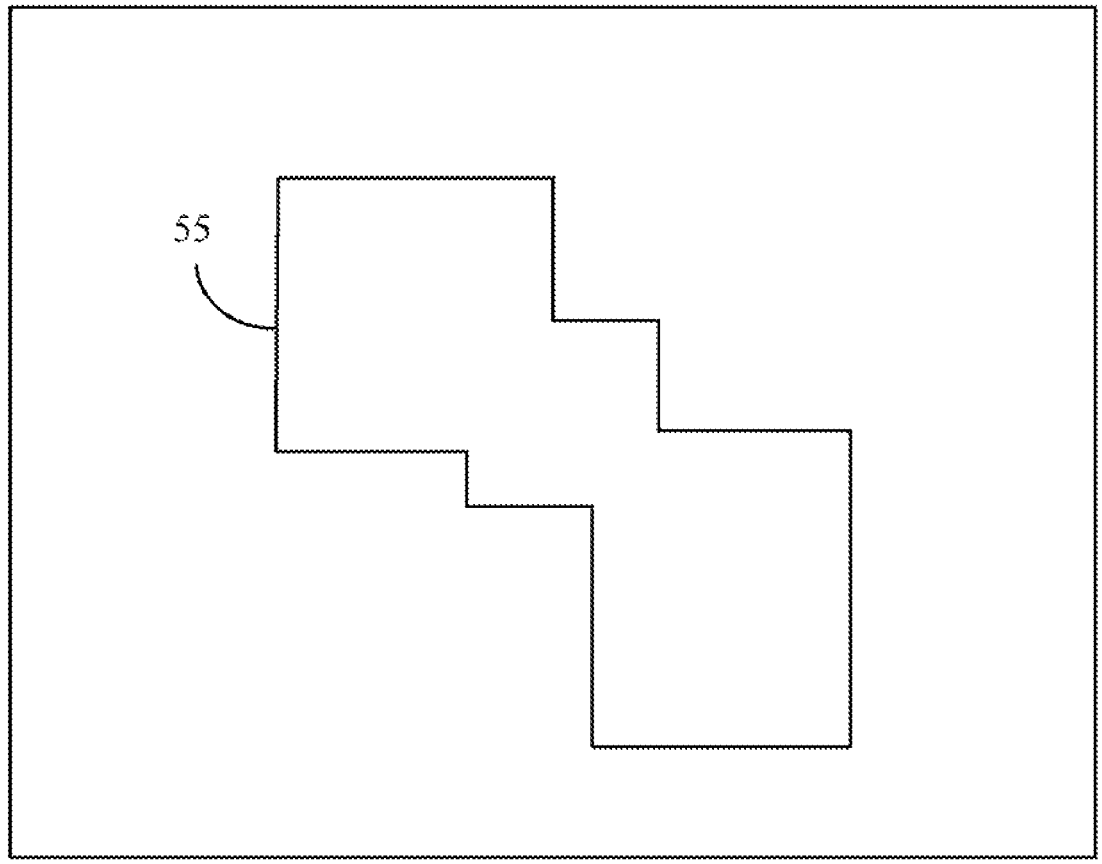
FIG. 3 is a schematic view showing all displayed polygons merged into a polygon in the displayed wiring diagram of the conventional printed circuit board layout system of FIG. 1.
Figure 4:
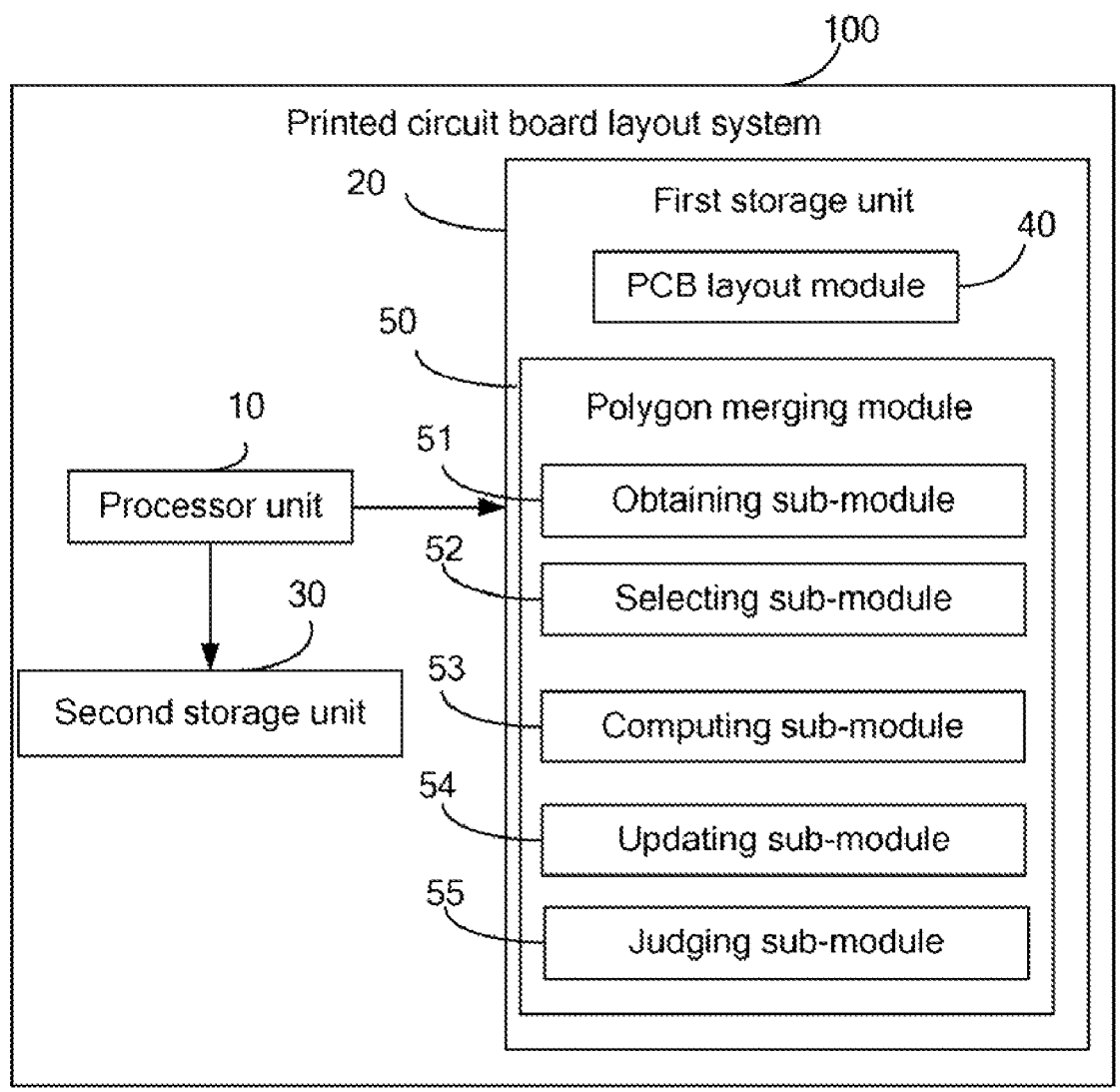
FIG. 4 is a block diagram of a printed circuit board layout system in accordance with an exemplary embodiment.
Figure 5:
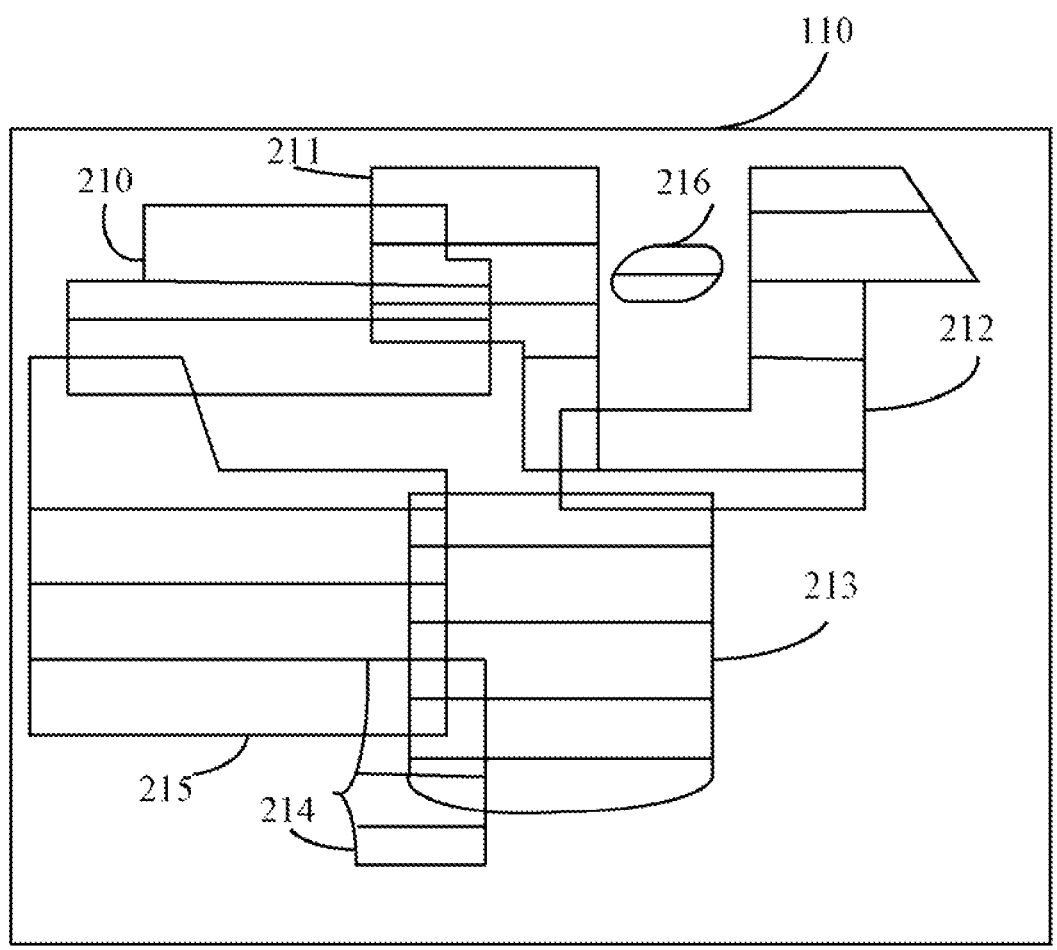
FIG. 5 is a schematic view showing overlapping polygons in a displayed wiring diagram of the printed circuit board layout system of FIG. 4.

Referring to FIGS. 4-5, a printed circuit board (PCB) layout system 100 in accordance with an exemplary embodiment is shown. The system 100 includes a processor unit 10, a first storage unit 20, and a second storage unit 30. The processor unit 10 executes a plurality of function modules in the first storage unit 20 to perform various functions. The plurality of function modules includes a PCB layout module 40 and a polygon merging module 50.

The module 40 is executed by the processor unit 10 to generate PCB files according to input wiring diagrams, and output a user interface 110 (see FIG. 5) showing an opened wiring diagram. The module 40 is further executed by the processor unit 10 to generate a plurality of polygons and record the profile attributes of each of the generated polygons. In the embodiment, each of the profile attributes includes a set of coordinates for describing the shape of the associated polygon. As shown in FIG. 5, a plurality of polygons 210, 211, 212, 213, 214, 215 and 216 are displayed in the user interface 110. The polygons 210, 211, 212, 213, 214, 215 overlap each other, but the polygon 216 does not.

The polygon merging module 50 includes an obtaining sub-module 51, a selecting sub-module 52, a computing sub-module 53, an updating sub-module 54, and a judging sub-module 55.

The obtaining sub-module 51 is executed by the processor unit 10 to obtain the profile attributes of selected polygons in one opened PCB file in response to user input. In the embodiment, the user can only select overlapping polygons. The obtained profile attributes are then stored in the second storage unit 30.

The selecting sub-module 52 is executed by the processor unit 10 to select two profile attributes each time from the second storage unit 30.

The computing sub-module 53 is executed by the processor unit 10 to determine whether two polygons corresponding to the selected profile attributes are overlapping according to the selected profile attributes. If the two polygons are overlapping, the computing sub-module 53 records a new profile attribute describing the shape of a new polygon of the combined shape of the two polygons excluding the lines indicating the overlapping portions of the two polygons.

The updating module 54 is executed by the processor unit 10 to replace the selected profile attributes with the new profile attribute.

Figure 6:
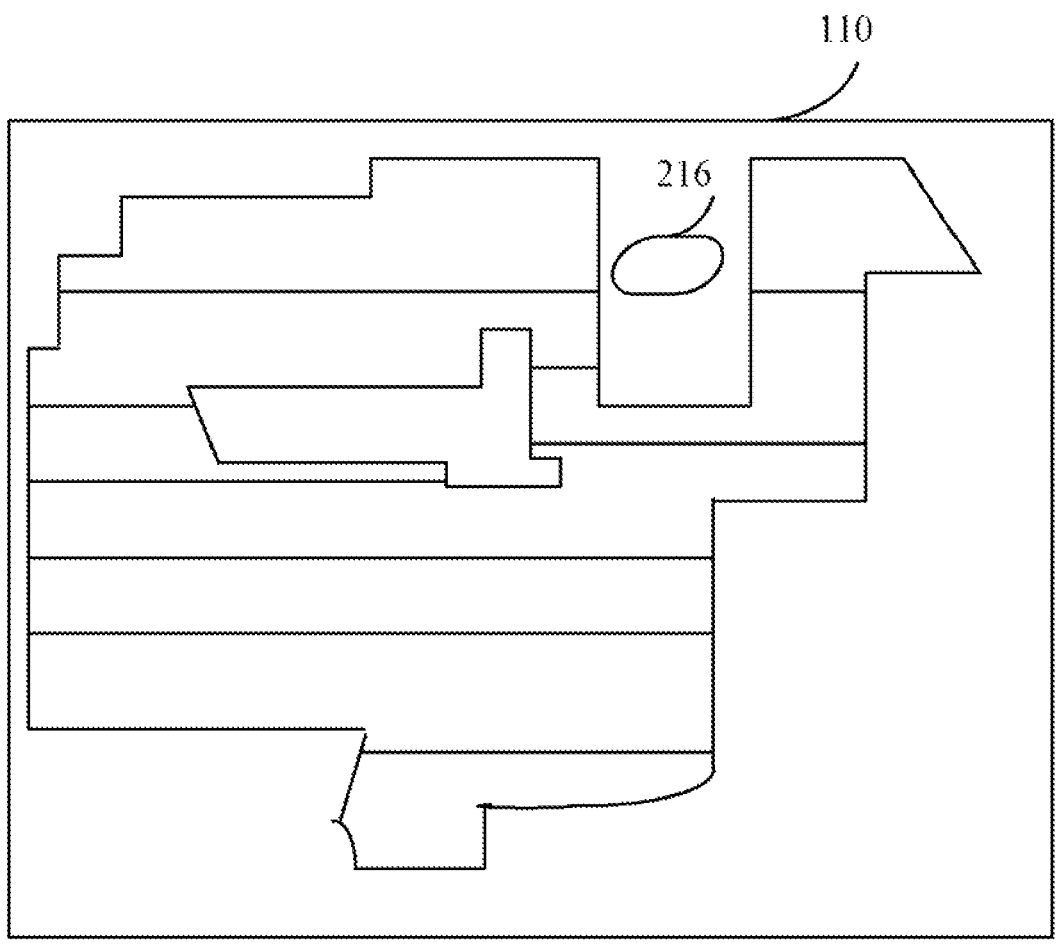
FIG. 6 is a schematic view showing all overlapping polygons merged into a polygon in the displayed wiring diagram of the printed circuit board layout system of FIG. 4.

The judging module 55 is executed by the processor unit 10 to determine whether only one profile attribute is stored in the second storage unit 30. In the embodiment, only one profile attribute stored in the second storage unit 30 indicates that the system 100 has merged all the selected polygons into one large polygon (see FIG. 6).

If there is only one profile attribute in the second storage unit 30, the module 40 updates the opened PCB file with the one profile attribute.

As described above, in the present disclosure when the user selects all the overlapping polygons, the system 100 can merge all the selected polygons into a polygon according to the default algorithm. Compared to the tedious conventional method of selecting one pair of polygons at a time, the present disclosure provides a much more efficient method.

Figure 7:
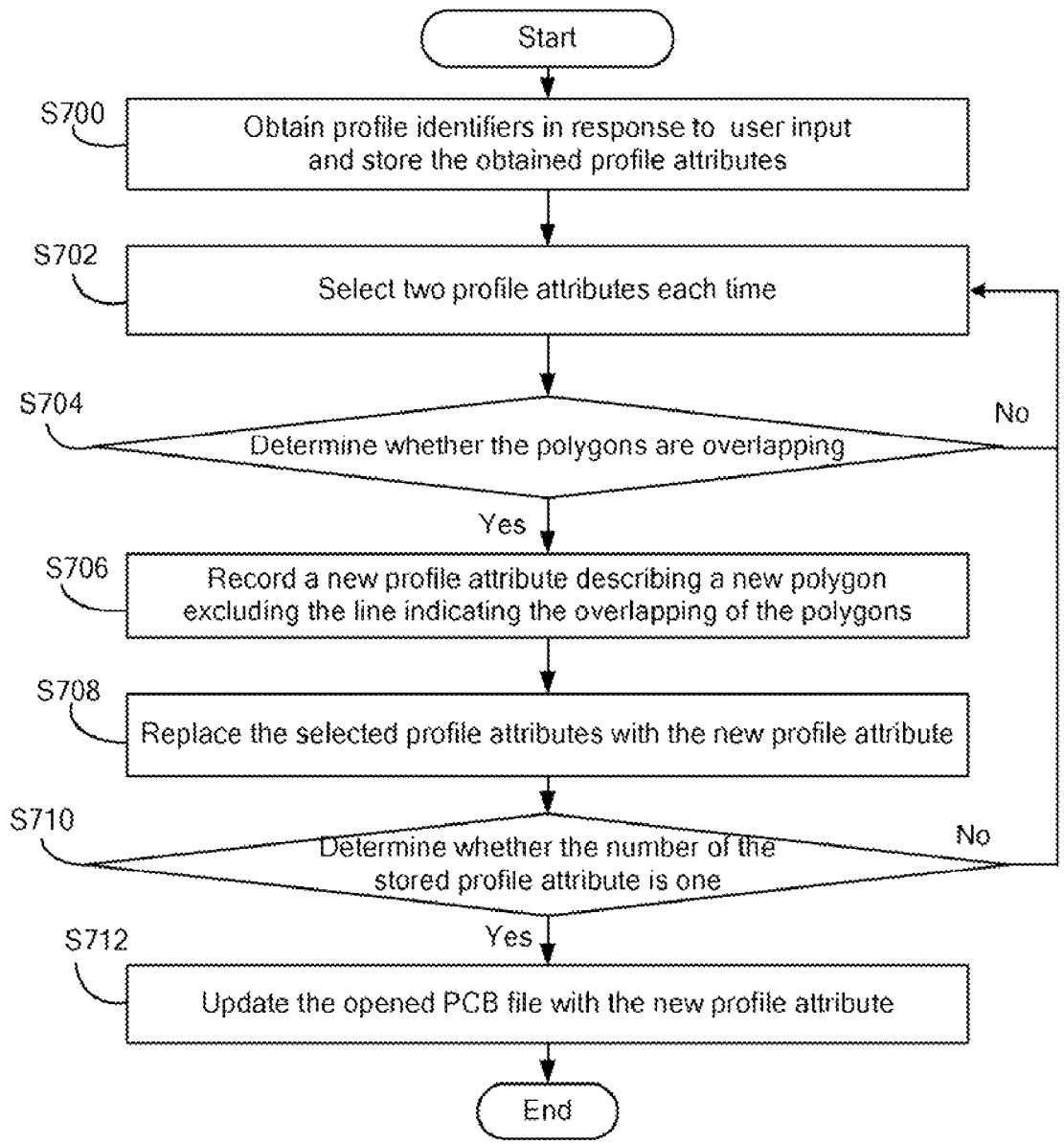
FIG. 7 is a flowchart of a method for merging overlapping polygons in accordance with an exemplary embodiment.

FIG. 7 is a flowchart of the method for merging the polygons in accordance with an exemplary embodiment.

In step S700, the obtaining sub-module 51 is executed by the processor unit 10 to obtain the profile attributes of selected polygons in response to the user input and stores the obtained profile attributes in the second storage unit 30.

In step S702, the selecting sub-module 52 is executed by the processor unit 10 to select two profile attributes each time from the second storage unit 30.

In step S704, the computing sub-module 53 is executed by the processor unit 10 to determine whether two polygons corresponding to the selected profile attributes are overlapping. If the two polygons are overlapping, the procedure goes to step S706, otherwise the procedure goes to step S702.

In step S706, the computing sub-module 53 is executed by the processor unit 10 to record a new profile attribute describing the shape of a new polygon of the combined shape of the two polygons excluding the lines indicating the overlapping portions of the two polygons.

In step S708, the updating sub-module 54 is executed by the processor unit 10 to replace the selected profile attributes with the new profile attribute.

In step S710, the judging sub-module 45 is executed by the processor unit 10 to determine whether the number of the profile attribute stored in the second storage unit 30 is one. If the number of the profile attribute stored in the second storage unit 30 is one, the procedure goes to step S712, otherwise the procedure goes to step S702.

In step S712, the module 40 is executed by the processor unit 10 to update the opened PCB file with the one profile attribute.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A printed circuit board layout system, comprising:
a first storage unit storing a plurality of function modules; and
a processor unit executing the plurality of function modules;
a second storage unit;
wherein the plurality of function modules comprises:
a PCB layout module configured to generate PCB files according to input wiring diagrams, and generate polygons and record profile attributes of each of the generated polygons;
a polygon merging module, comprising:
an obtaining sub-module configured to obtain profile attributes of selected polygons in one opened PCB file in response to user input and output the profile attributes to the second storage unit;
a selecting sub-module configured to select two profile attributes each time from the second storage unit; and
a computing sub-module configured to determine whether two polygons corresponding to the selected profile attributes are overlapping according to the selected profile attributes, and record a new profile attribute describing the shape of a new polygon of a combined shape of the two polygons excluding lines indicating the overlapping portion of the two polygons if the two polygons are overlapping.

2. The system as described in claim 1, wherein the plurality of the function modules further comprise a updating sub-module configured to replace the selected profile attributes with the new profile attribute if the two polygons corresponding to the selected profile attributes are overlapping.

3. The system as described in claim 1, wherein the plurality of function modules further comprises a judging sub-module configured to determine whether the number of the profile attribute in the second storage unit is one, if the number of the profile attribute in the second storage unit is one, the PCB layout module updates the opened PCB file with the one profile attribute.

4. A method for merging polygons of a printed circuit board layout system, the system comprising a processor which generates PCB files according to input wiring diagrams, and further generates polygons and records profile attributes of each of the generated polygons, the method comprising:
obtaining profile attributes of selected polygons in one opened PCB file in response to user input via the processor;
storing the profile attributes;
selecting two profile attributes each time from the stored profile attributes via the processor; and
determining whether two polygons corresponding to the selected profile attribute are overlapping via the processor, and recording a new profile attribute describing the shape of a new polygon of a combined shape of the two polygons excluding lines indicating the overlapping portions of the two polygons if two polygons are overlapping via the processor.

5. The method for merging polygons of the printed circuit board layout system as described in claim 4 further comprising: replacing the selected profile attributes with the new profile attribute according to the new profile attribute.

6. The method for merging polygons of the printed circuit board layout system as described in claim 5 further comprising:
determining whether the number of the stored profile attribute is one;
selecting new profile attributes from the stored profile attributes if the number of the stored profile attribute is not one;
updating the opened PCB file with the new profile attribute if the number of the stored profile attribute is one.

* * * * *